(12) United States Patent
Chou

(10) Patent No.: US 6,543,906 B2
(45) Date of Patent: Apr. 8, 2003

(54) LAMPSHADE WITH PLATING FILM LAYER

(75) Inventor: Chung Lin Chou, Taipei (TW)

(73) Assignee: Cosmos Vacuum Technology Corporation, Taipei Hsien (TW)

( * ) Notice: Subject to any disclaimer, the term of this patent is extended or adjusted under 35 U.S.C. 154(b) by 6 days.

(21) Appl. No.: 09/731,016

(22) Filed: Dec. 7, 2000

(65) Prior Publication Data

US 2002/0071273 A1 Jun. 13, 2002

(51) Int. Cl.[7] ................................................. F21V 19/00
(52) U.S. Cl. ...................... 362/226; 362/306; 362/548; 362/190
(58) Field of Search ................................. 362/306, 226, 362/351, 361, 437, 390, 369, 159, 191, 190, 519, 548; 439/840, 841, 300, 299, 220, 607, 617

(56) References Cited

U.S. PATENT DOCUMENTS 5,465,025 A * 11/1995 Hendrickson .......... 313/318.09
5,565,052 A * 10/1996 Papenburg et al. .......... 156/155
6,145,997 A * 11/2000 Sedovic et al. ............. 362/208
6,276,812 B1 * 8/2001 Helbig et al. ............... 362/226
6,318,881 B1 * 11/2001 Lawrence ................... 362/226
6,322,231 B1 * 11/2001 Parsons et al. ............. 362/110
6,409,366 B1 * 6/2002 Kondo et al. ............... 362/473

* cited by examiner

Primary Examiner—Sandra O'Shea
Assistant Examiner—Anabel Ton
(74) Attorney, Agent, or Firm—Rosenberg, Klein & Lee

(57) ABSTRACT

A lampshade with a plating film layer is made of ceramics. The plating film layer is formed by a low temperature sputter coating on the lampshade. The color of the plating film layer can be varied, and is tolerable of high temperature. A receiving chamber is installed in the lampshade. A receptacle is elastically supported in the receiving chamber. The inner wall of the receiving chamber has an inner thread. The inner thread and receptacle serve for inputting power so that pins of a bulb are connected to the receptacle or threaded into the inner thread.

3 Claims, 5 Drawing Sheets

LAMPSHADE WITH PLATING FILM LAYER

FIELD OF THE INVENTION

The present invention relates to a lampshade with a plating film layer, and especially to a lampshade with a high temperature tolerance, a user-friendly insulation, and decorative colors. Furthermore, the lampshade with a plating film layer complies with environmental protection requirements.

BACKGROUND OF THE INVENTION

With the progress of modern living styles, decorating lamps are more and more important in human life. The lamps are used in indoor decoration to increase the light and beauty of the environment. Therefore, many lamps, such as wall lamps, hanging lamps, table lamps, ground lamps or track lamps have been developed.

The prior art of plastic lamps have inner walls which are coated with a plating layer to reflect light. As a bulb lights up, the light is reflected by the plating layer. Although such design has a low cost, it has a poor heat dissipation and lacks tolerance for high temperatures. Thus, the traditional lampshade and lamp have a shorter half life because the lampshade is susceptible to cracking under high temperatures and the plating is easily stripped off.

Therefore, it is obvious that the prior art design has defects which requires improvement.

SUMMARY OF THE INVENTION

Accordingly, the primary objective of the present invention is to provide a lampshade with a plating film layer, wherein the color of the plating film layer can be varied, is tolerable to high temperatures, and has a preferred fire-proof effect. The lampshade will not crack due to high temperature. The plating film layer will not be stripped off. Therefore, the lampshade and moreover, the whole lamp will have a longer lifetime. Furthermore, the lampshade of the present invention is ceramic, and thus, can be reused for meeting environmental protection requirements.

Another objective of the present invention is to provide a lampshade with a plating film layer, wherein the lampshade is suitable for halogen lamps, light emitting diode bulbs and conventional lamps.

A further objective of the present invention is to provide a lampshade with a plating film layer, wherein the lampshade is made of ceramics. The plating film layer is formed by a low temperature sputter coating on the lampshade. A receiving chamber is installed in the lampshade. A receptacle is elastically supported in the receiving chamber. The inner wall of the receiving chamber has an inner thread. The inner thread and receptacle serves for inputting power so that pins of a bulb are connected to the receptacle or threaded into the inner thread. The present invention is suitable for halogen lamps, light emitting diode bulbs and conventional lamps.

The various objectives and advantages of the present invention will be more readily understood from the following detailed description when read in conjunction with the appended drawings.

DETAILED DESCRIPTION OF THE PREFERRED EMBODIMENTS

Figure 1:
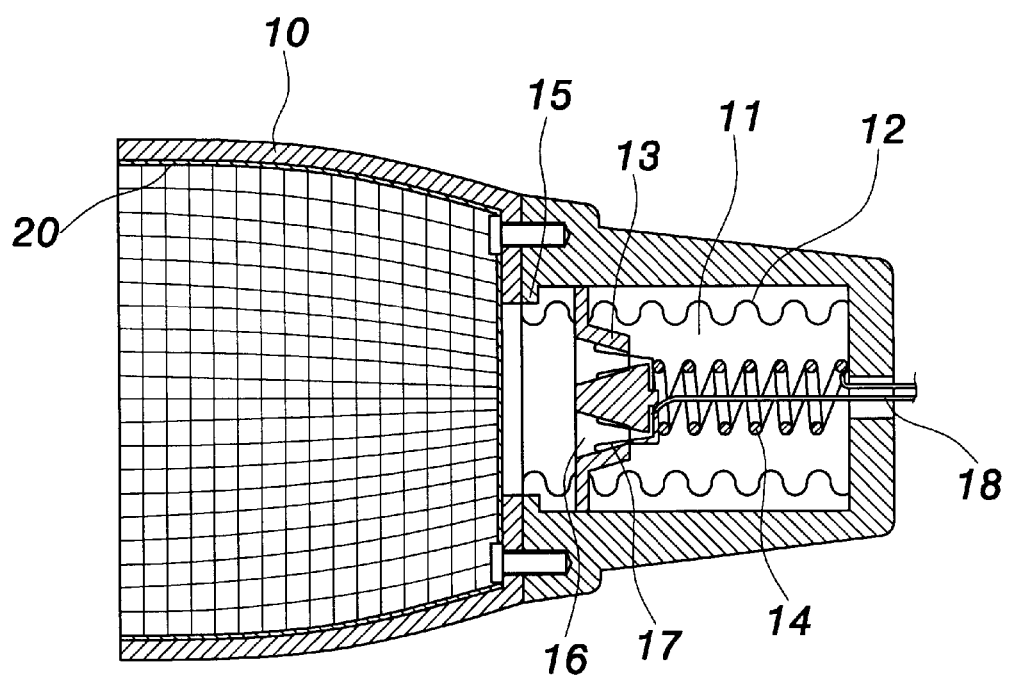
FIG. 1 is a cross sectional view of the present invention.

Referring to FIG. 1, the cross sectional view of the present invention is illustrated. The present invention provides a lampshade with a plating film layer. The lampshade 10 (see FIG. 1) made of a ceramic material, and can have various shapes, as desired. The inner wall of the lampshade 10 is installed with a plating film layer 20 manufactured by a low temperature sputter process.

Figure 2:
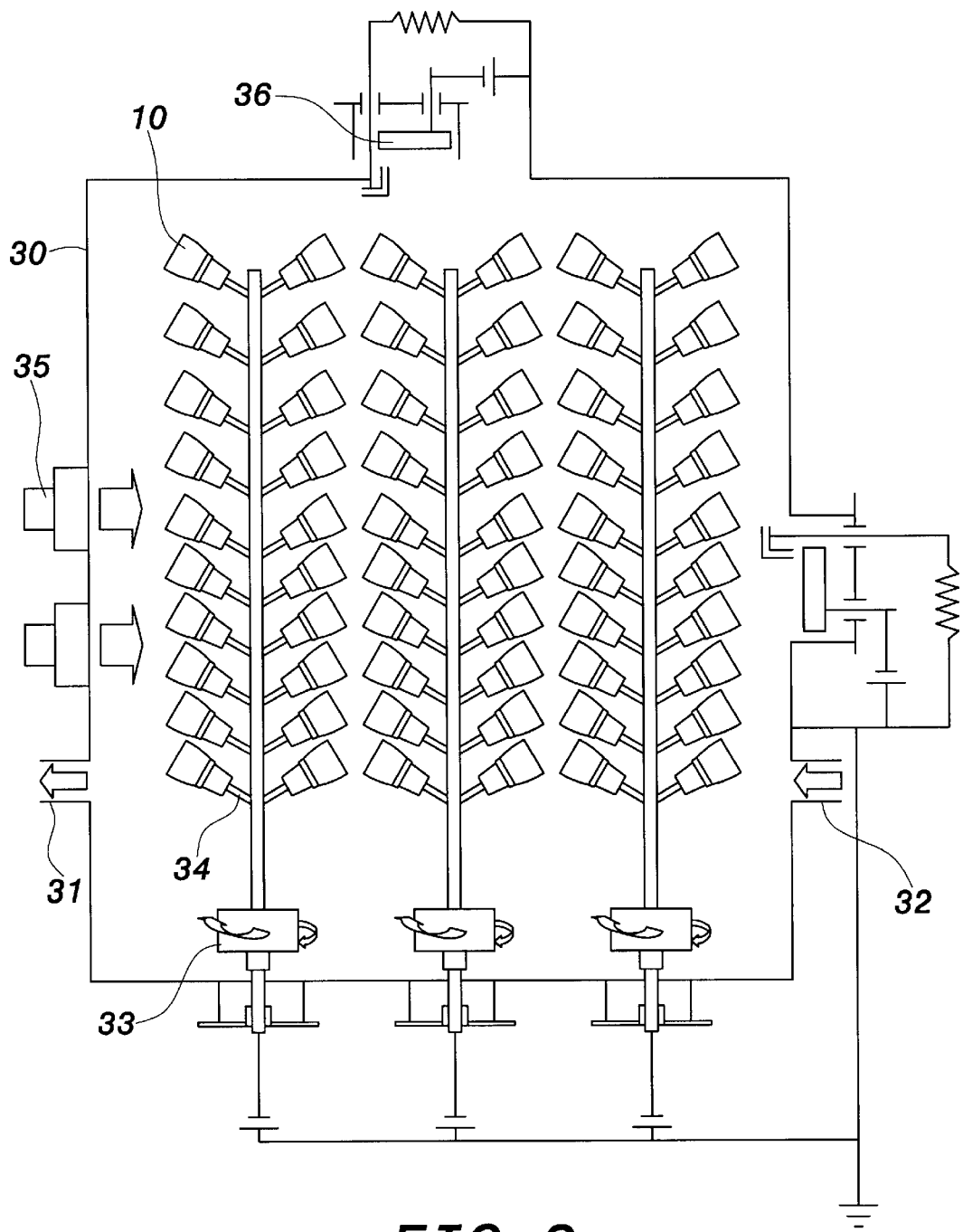
FIG. 2 is a schematic view of the lampshade sputtering system of the present invention.

Referring to FIG. 2, a schematic view of the lampshade sputtering system of the present invention is illustrated. In the present invention, a P.V.D. ion cleaning (physical sputter) and ion coating are used for coating TiN (titanium nitride), ZrN (zirconium nitride), or CrCN (chromium carbon nitride) and other elements on the lampshade 10. The sputtering system has a chamber 30. The chamber 30 has a gas outlet 31 for being connected to a pump for pumping the inner part of the chamber 30 to become a vacuum chamber. The chamber 30 is further installed with a gas inlet 32 for inputting reactive gas. A work piece frame 33 is installed within the chamber 30. The work piece frame 33 is installed with a plurality of work piece fixtures 34. The work piece frame 33 is rotatable for driving the lampshade 10 on the work piece fixture 34 to rotate. The chamber 30 is installed with an ion source 35 and an arc source 36. The arc source 36 may emit small ions and then by the assistance of the ion source 35, the ions from the arc source 36 are further ionized so as to have a preferred adhesion and be easily formed with a multiple-element plating film layer 20 with other ions (see FIG. 1). Therefore, by the aforesaid structure, a lampshade 10 of the present invention is formed.

The inner side of the lampshade 10 is installed with a receiving chamber 11. The inner wall of the receiving chamber 11 is formed with the inner thread 12. The inner thread 12 can be formed with a plating film layer or a copper piece, or other conductors having a conductive function by a low temperature sputter process for inputting proper power. The receiving chamber 11 has a receptacle 13. The receptacle 13 can be received in the receiving chamber 11 for moving forwards and backwards freely. A spring 14 is installed in the receiving chamber 11 for elastically supporting the receptacle 13 in the receiving chamber 11. The front end of the receiving chamber 11 is installed with a stop 15 for preventing the receptacle 13 from moving out of the receiving chamber 11 when moving forward. The receptacle 13 is installed with two inserting holes 16 and each inserting hole 16 is installed with a copper clip 17 therein. The copper clip 17 is connected to a proper lead 18 for inputting proper power to the copper clip 17. Therefore, by the aforesaid structure, a lampshade of the present invention is assembled.

Figure 4:
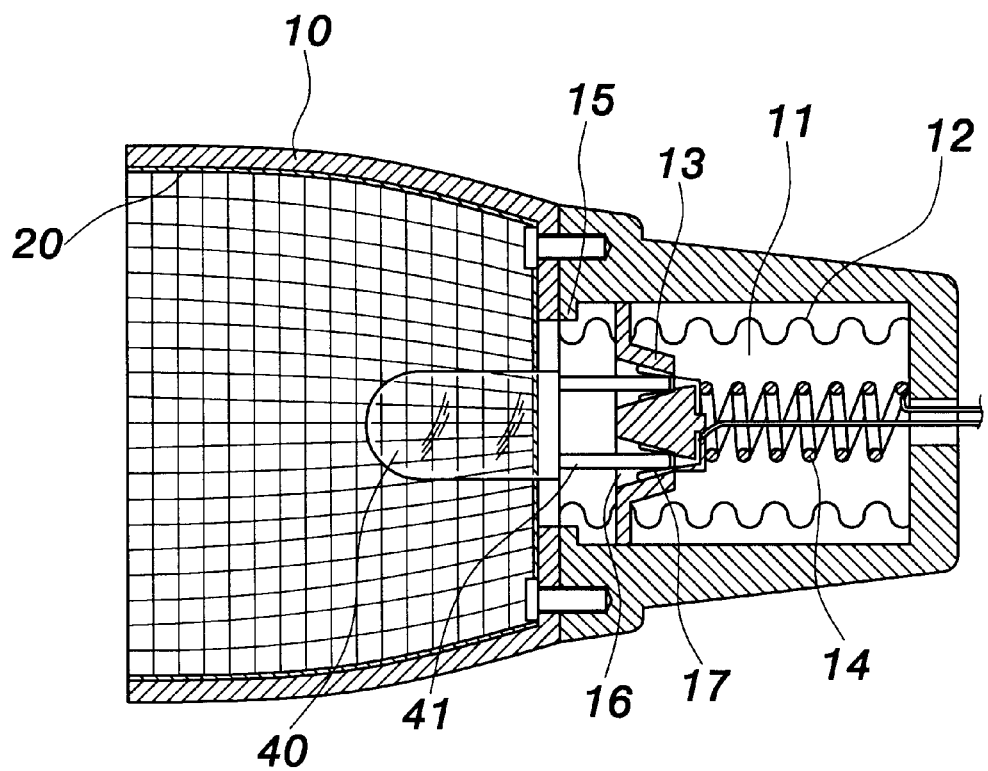
FIG. 4 is a schematic view illustrating the use of the present invention.

Referring to FIG. 4, the lampshade 10 of the present invention can be suitable for the general halogen lamp (or light emitting diode) 40. The halogen lamp 40 has two pins inserted into the inserting holes 16 of the receptacle 13. The two pins 14 are further clamped in the two copper clips 17 for fixing the halogen lamp 40 so that power can be transferred to the halogen lamp 40 and then the halogen lamp 40 lights up.

Figure 5:
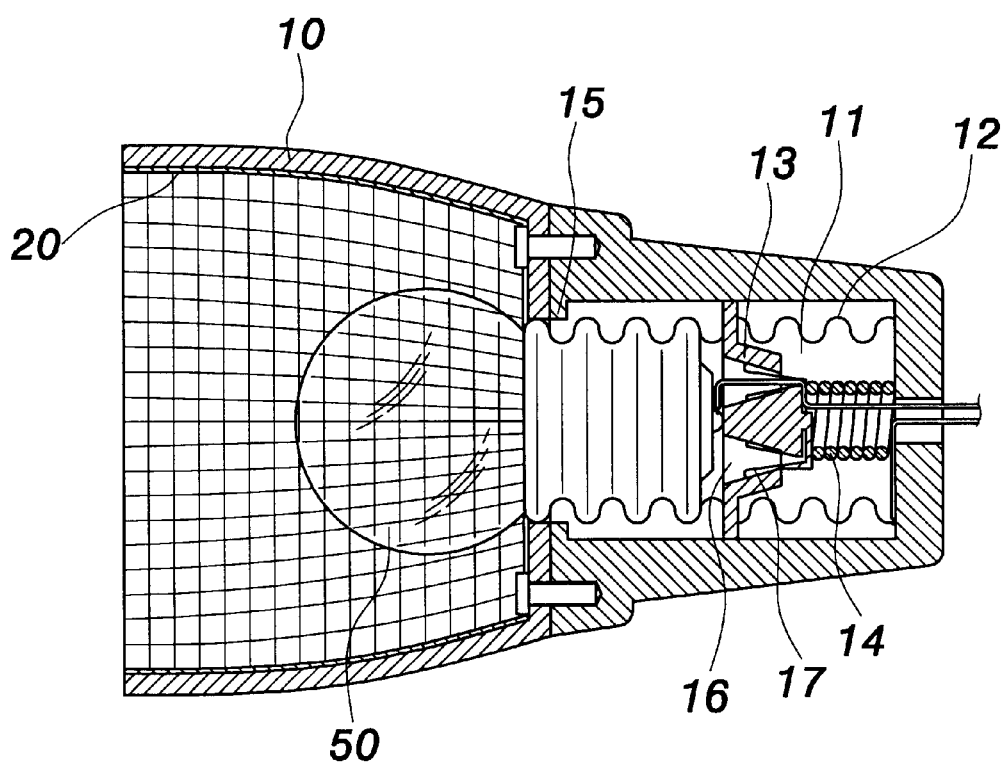
FIG. 5 is a schematic view showing another application of the present invention.

With reference to FIG. 5, the lampshade 10 of the present invention can be used in a conventional bulb 50. The bulb 50 presses against the receptacle 13 to be displaced into the receiving chamber 11. The bulb 50 is threaded with the inner thread 12 for fixing the bulb 50 so that power can be transferred to the bulb 50.

The present invention is suitable for a halogen lamp, a light emitting diode lamp, and a conventional lamp. Therefore, the present invention can be used widely, and the cost for molds can be reduced and therefore, the manufacturing cost is decreased greatly.

The zirconium and titanium used in the present invention belong to the same family, and most properties thereof are identical to titanium, but have a lower ionization energy and have a smaller particle size and a good heat dissipation. The hardness of TiN may achieve a value of 2400 HV and has a gold yellow color. ZrN has a hardness of 3100 HV and has a gold green color. The CrCN has a hardness of 2400 HV and has a gold color.

In the present invention, the ion sputtered coating in the PVD vacuum may be formed with a plating film layer 20 with a uniform coating and has a lower coating temperature without any thermal deformation and any thermal stress. The ceramic material can retain the original physical nature. The thickness of the film is controllable by sputter timing.

The PVD (physical sputter) used in the present invention is a lower temperature process (120° C. to 380° C.). As the lampshade is coated with various elements, it has a preferred adhesion, a high hardness and a high density. The plating film layer 20 is installed within the lampshade 10, and thus a good reflectivity is provided. When the bulb lights up, the light can be reflected by way of the plating film layer 20. The lampshade of the present invention is made by ceramics and has a plating film layer 20 with a preferred insulation characteristic. The color of the plating film layer 20 can be varied, is tolerable to high temperatures, and has a preferred fireproof nature. The lampshade will not crack due to high temperatures. The plating film layer 20 will not be stripped off. Therefore, the lampshade and moreover, the whole lamp have a longer lifetime. Furthermore, the lampshade 10 of the present invention is made of ceramics, and thus, can be reused for meeting environmental requirements.

Figure 3:
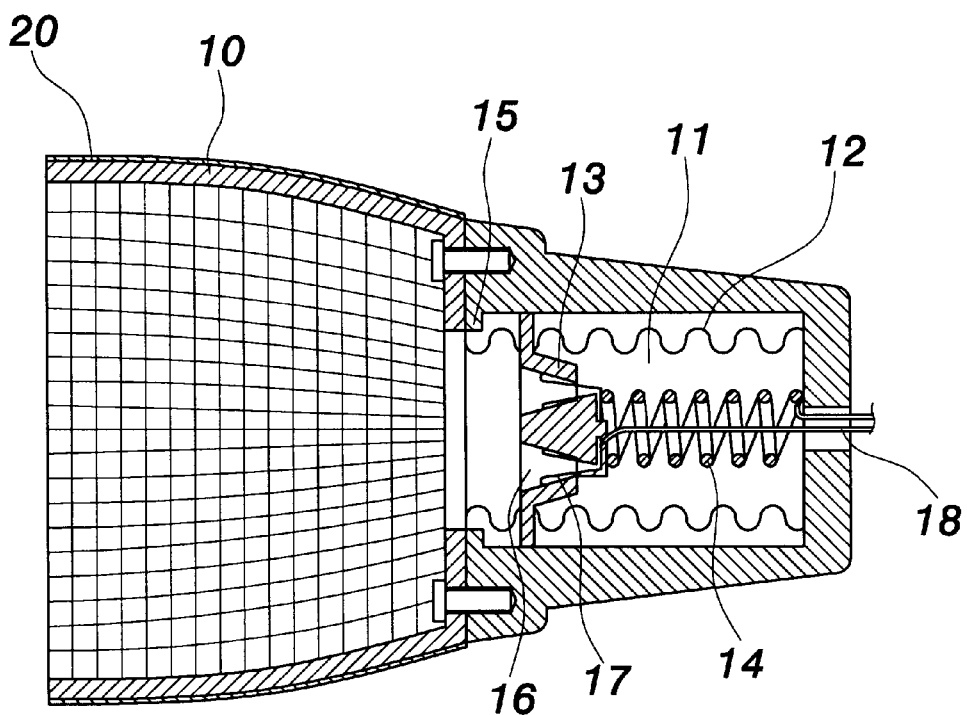
FIG. 3 is a cross sectional view of the lampshade in the first embodiment in the present invention.

Moreover, referring to FIG. 3, other than being installed at the inner wall of the lampshade 10, the plating film layer 20 formed by PVD vacuum ion sputter coating may be formed on the outer wall of the lampshade 10 for enhancing the exterior of the lampshade to be more decorative.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A lamp shade formed of a ceramic material comprising:

a lamp shade member having opposed open ends, said lamp shade member having a plating film layer formed on an inner surface thereof;

a hollow receiving member having an open end and a closed end, said open end of said hollow receiving member being fixedly secured to one of said open ends of said lamp shade member, an interior surface of said hollow receiving member being threaded to receive and engage a light bulb having a threaded contact surface;

an electrical contact receptacle mounted within said hollow receiving member; and, a spring member having first and second ends, said first end contacting a rear surface of said electrical contact receptacle, said second end contacting said closed end of said hollow receiving member, said spring member elastically supporting said electrical contact receptacle within said hollow receiving member.

2. The lamp shade formed of a ceramic material as recited in claim 1, wherein said electrical contact receptacle has a pair of inserting holes formed therethrough, each of said inserting holes receiving a copper clamping member, each of said copper clamping members being in electrical communication with an electrical power lead.

3. The lamp shade formed of a ceramic material as recited in claim 1 wherein said plating film layer is formed on said inner surface of said lamp shade member by a low temperature sputtering method.

* * * * *